US012694169B2

(12) United States Patent
Jing et al.

(10) Patent No.: US 12,694,169 B2
(45) Date of Patent: Jul. 28, 2026

(54) WHEEL-RAIL STEEL EQUIVALENT FATIGUE DAMAGE SIMULATION METHOD

(71) Applicant: Southwest Jiaotong University, Chengdu (CN)

(72) Inventors: Lin Jing, Chengdu (CN); Xingya Su, Chengdu (CN); Chao Feng, Chengdu (CN); Kai Liu, Chengdu (CN); Xiongfei Zhou, Chengdu (CN); Kaiyun Wang, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 981 days.

(21) Appl. No.: 17/949,226

(22) Filed: Sep. 21, 2022

(65) Prior Publication Data

US 2023/0281352 A1 Sep. 7, 2023

(30) Foreign Application Priority Data

Mar. 7, 2022 (CN) .......................... 202210214166.8

(51) Int. Cl.
| | |
|---|---|
| *G06F 30/15* | (2020.01) |
| *B61L 23/04* | (2006.01) |
| *G06F 30/20* | (2020.01) |

(52) U.S. Cl.
CPC ............ *G06F 30/15* (2020.01); *B61L 23/045* (2013.01); *G06F 30/20* (2020.01)

(58) Field of Classification Search
CPC .......... G06F 30/15; G06F 30/20; G06F 30/17;
G06F 2119/02; G06F 2119/14; G06F 30/25; G06F 30/27; G06F 30/28; B61L 23/045; B61L 27/53; B61L 27/57; B61L 27/60; Y02T 90/00
See application file for complete search history.

(56) References Cited

U.S. PATENT DOCUMENTS

2014/0300122 A1* 10/2014 Golyshkov ......... B60B 17/0055
295/21

OTHER PUBLICATIONS

Cong, Tao, et al. "Study on damage tolerance and remain fatigue life of shattered rim of railway wheels." Engineering Failure Analysis 123 (2021): 105322. (Year: 2021).*

(Continued)

*Primary Examiner* — Saif A Alhija

(57) ABSTRACT

The present application provides a simulation method for equivalent fatigue damage of wheel-rail steel, and relates to the study of wheel-rail relationship of rail transportation. After obtaining the train load spectrum when the target train serves for the preset mileage, the wheel-rail systematic 3D model corresponding to the target train is assigned to simulate the load according to the train load spectrum to obtain the stress spectrum of the dangerous part of the rim, and determine the target stress and stress application frequency corresponding to the expected simulated mileage according to the stress spectrum of the dangerous part of the rim. Then, the driving fatigue test machine carries out fatigue tests on the wheel-rail steel fatigue sample of the target train according to the target stress and stress application frequency, and obtains the equivalent fatigue damage data of the wheel-rail steel at the expected simulated mileage of the target train.

12 Claims, 5 Drawing Sheets

Acquire a train load spectrum of a target train serving a preset mileage ⟶ S210

Assign a wheel-rail systematic three-dimensional model corresponding to the target train according to the train load spectrum, to perform load application simulation to obtain a stress spectrum of a dangerous part of a rim of the target train that matches the preset mileage ⟶ S220

Determine a target stress and a stress application frequency corresponding to the expected simulation mileage to be acted on a wheel-rail steel fatigue sample of the target train according to the stress spectrum of the dangerous part of the rim ⟶ S230

Drive a fatigue test machine to initiate a fatigue test on the wheel-rail steel fatigue sample according to the determined target stress and stress application frequency, to obtain wheel-rail steel equivalent fatigue damage data of the target train serving the expected simulation mileage ⟶ S240

(56) References Cited

OTHER PUBLICATIONS

Bevan, Adam, et al. "Development and validation of a wheel wear and rolling contact fatigue damage model." Wear 307.1-2 (2013): 100-111 (Year: 2013).*

Ringsberg, Jonas W., and Torbjorn Lindback. "Rolling contact fatigue analysis of rails inculding numerical simulations of the rail manufacturing process and repeated wheel-rail contact loads." International Journal of fatigue 25.6 (2003): 547-558 (Year: 2003).*

* cited by examiner

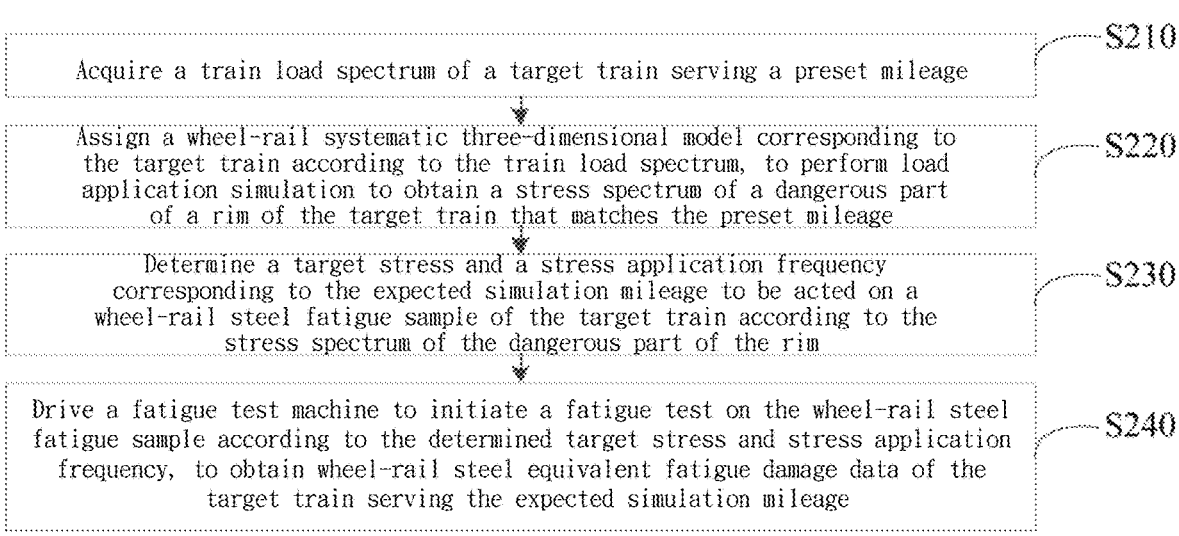

Acquire a train load spectrum of a target train serving a preset mileage — S210

Assign a wheel-rail systematic three-dimensional model corresponding to the target train according to the train load spectrum, to perform load application simulation to obtain a stress spectrum of a dangerous part of a rim of the target train that matches the preset mileage — S220

Determine a target stress and a stress application frequency corresponding to the expected simulation mileage to be acted on a wheel-rail steel fatigue sample of the target train according to the stress spectrum of the dangerous part of the rim — S230

Drive a fatigue test machine to initiate a fatigue test on the wheel-rail steel fatigue sample according to the determined target stress and stress application frequency, to obtain wheel-rail steel equivalent fatigue damage data of the target train serving the expected simulation mileage — S240

FIG. 3

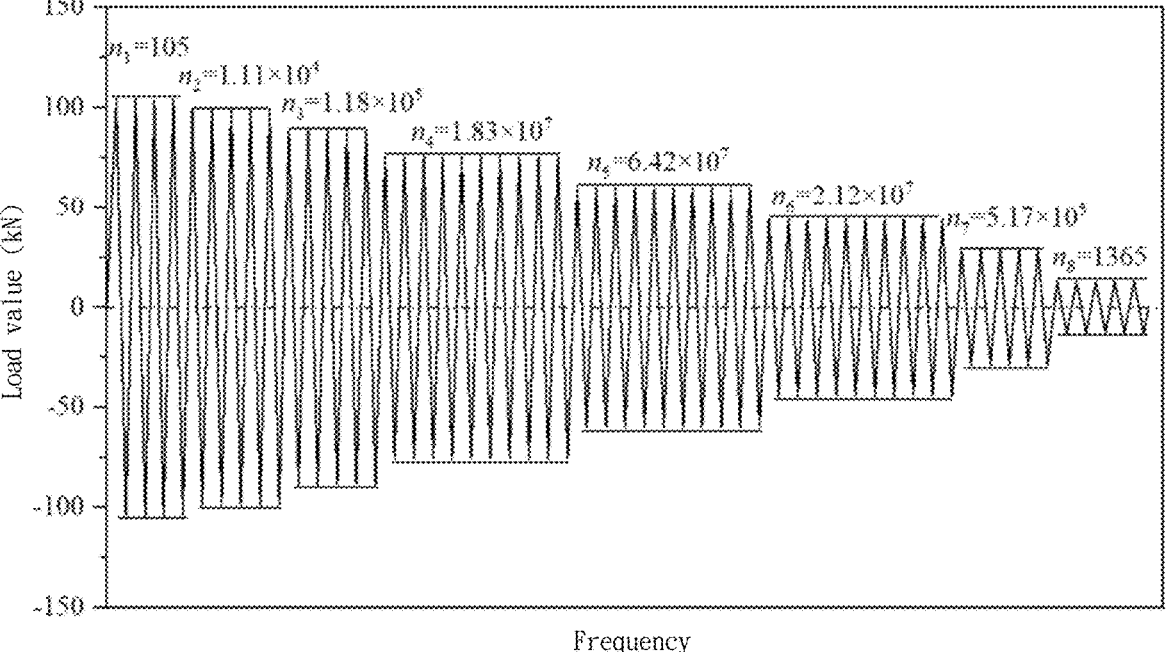

FIG. 4

Apply each of loads of different levels corresponding to the train load spectrum on the wheel-rail systematic three-dimensional model according to respective load occurrence frequencies, to perform static contact mechanical behavioral simulation on the wheel-rail system, in order to obtain a rim danger stress and stress occurrence frequency of the dangerous part of rim of the target train based on each of the loads of different levels ⌐—S221

Perform data arrangement upon rim danger stresses and stress occurrence frequencies respectively corresponding to the loads of different levels corresponding to the train load spectrum, to obtain the stress spectrum of the dangerous part of the rim ⌐—S222

FIG. 7

Sort respective stress occurrence frequencies of all rim danger stresses in the stress spectrum of the dangerous part of the rim in a descending order, to obtain a corresponding stress-frequency sorting result ⌐—S231

Perform dividing operation upon the stress occurrence frequency and the preset mileage of the rim danger stress for each kind of rim danger stresses in the stress spectrum of the dangerous part of the rim, to obtain the occurrence frequency in the unit mileage of the rim danger stress during the service process of the target train ⌐—S232

Select at least one wheel rim dangerous stress with the highest ranking among the stress spectrum of the dangerous part of the rim as the target stress ⌐—S233

Perform multiplication operation upon the occurrence frequency in the unit mileage the expected simulation mileage for each target stress, to obtain the stress application frequency of the target stress ⌐—S234

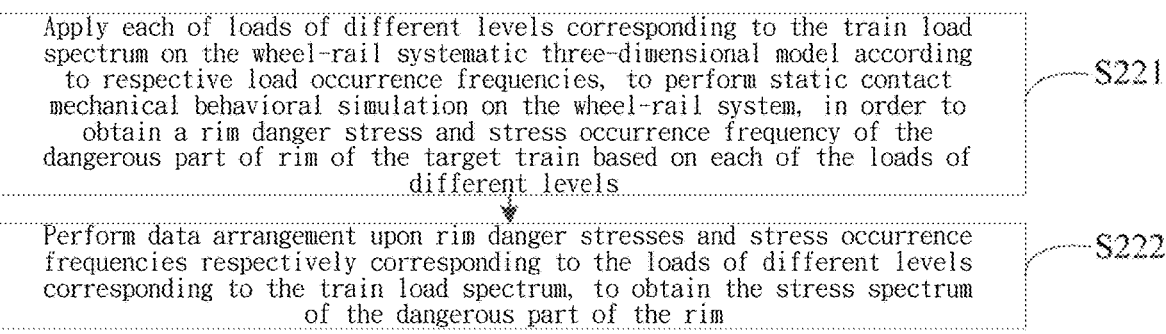

| Train load spectrum acquisition module ⌐110 | Rim stress spectrum simulation module ⌐120 | Sample function parameter determination module ⌐130 |

Equivalent fatigue test driving module ⌐140

WHEEL-RAIL STEEL EQUIVALENT FATIGUE DAMAGE SIMULATION METHOD

CROSS-REFERENCE TO RELATED APPLICATION

This application is a continuation application of China application No. 202210214166.8 filed on Mar. 7, 2022. The contents of this application are hereby incorporated by reference in their entireties.

FIELD OF THE INVENTION

The present application relates to the study in the field of wheel-rail relationship of the rail transportation, and more specifically, to a wheel-rail steel equivalent fatigue damage simulation method.

BACKGROUND OF THE INVENTION

With the continuous development of science and technology, railway lines have become an extremely important means of transportation in modern society, and its safety is closely related to people's lives. In the process of train service, complex interaction will occur between wheel and rail, which will easily lead to rolling contact fatigue damage on the wheel-rail surface. If the wheel and rail are not maintained in time, it will definitely endanger the safety of train operation. Therefore, in order to implement the wheel-rail operation and maintenance in time, how to effectively test the actual fatigue damage of the wheel-rail steel in the train service process is an important technical issue to be solved at present.

SUMMARY OF THE INVENTION

In view of the above, an objective of the present application is to provide a wheel-rail steel equivalent fatigue damage simulation method, device, calculation equipment and readable storage medium, capable of easily and instantly performing equivalent simulation test for the actual fatigue damage situation of the wheel-rail steel in the train service process, so as to instantly initiating subsequent wheel-rail operation maintenance.

In order to realize the above objective, embodiments of the present application adopt following technical solutions.

According to a first aspect, the present application provides a wheel-rail steel equivalent fatigue damage simulation method that comprises: acquiring a train load spectrum of a target train serving for a preset mileage; assigning a wheel-rail systematic three-dimensional model corresponding to the target train according to the train load spectrum, to perform load application simulation to obtain a stress spectrum of a dangerous part of a rim of the target train that matches the preset mileage; determining a target stress and a stress application frequency corresponding to expected simulation mileage to be acted on a wheel-rail steel fatigue sample of the target train according to the stress spectrum of the dangerous part of the rim; driving a fatigue test machine to initiate a fatigue test on the wheel-rail steel fatigue sample according to the determined target stress and stress application frequency, to obtain wheel-rail steel equivalent fatigue damage data of the target train serving for the expected simulation mileage.

In an alternative implementation, the step of acquiring the train load spectrum of the target train serving for the preset mileage comprises: calculating a load value of the load in first level among the loads in different levels corresponding to the target train in the train load spectrum according to a wheelset weight and train axle load of the target train; calculating the occurrence frequency of the load in first level during a service process of the preset mileage according to the possibility the load in first level occurs during the service process of the preset mileage and the possibility the loads in different levels occur during the service process of the target train; calculating respective load values of loads in different levels based on the load value of the load in first level according to a preset load ratio among the loads in different levels; calculating frequencies the respective loads of loads in different levels based on the loads in first level, according to a preset frequency ratio among the loads in different levels.

In an alternative implementation, the step of assigning the wheel-rail systematic three-dimensional model corresponding to the target train according to the train load spectrum to perform load application simulation to obtain the stress spectrum of the dangerous part of the rim of the target train matching the preset mileage comprises: applying each of loads in different levels corresponding to the train load spectrum on the wheel-rail systematic three-dimensional model according to respective load occurrence frequencies, to perform static contact mechanical behavioral simulation on the wheel-rail system, in order to obtain a rim danger stress and stress occurrence frequency of the dangerous part of rim of the target train based on each of the loads in different levels; and performing data arrangement upon rim danger stresses and stress occurrence frequencies respectively corresponding to the loads in different levels corresponding to the train load spectrum, to obtain the stress spectrum of the dangerous part of the rim.

In an alternative implementation, the step of determining the target stress and the stress application frequency corresponding to the expected simulation mileage to be acted on the wheel-rail steel fatigue sample of the target train according to the stress spectrum of the dangerous part of the rim comprises: sorting respective stress occurrence frequencies of all rim danger stresses in the stress spectrum of the dangerous part of the rim in a descending order, to obtain a corresponding stress-frequency sorting result; performing division operation upon the stress occurrence frequency and the preset mileage of the rim danger stress for each kind of rim danger stresses in the stress spectrum of the dangerous part of the rim, to obtain the occurrence frequency in the unit mileage of the rim danger stress during the service process of the target train; selecting at least one wheel rim danger stress with the highest ranking among the stress spectrum of the dangerous part of the rim as the target stress; and performing multiplication operation upon the occurrence frequency in the unit mileage and the expected simulation mileage for each target stress, to obtain the stress application frequency of the target stress.

According to a second aspect, the present application provides a device for simulating wheel-rail steel equivalent fatigue damage comprising a train load spectrum acquisition module, a rim stress spectrum simulation module, a sample function parameter determination module, and an equivalent fatigue test driving module. The train load spectrum acquisition module is configured to acquire a train load spectrum of a target train serving for a preset mileage. The rim stress spectrum simulation module is configured to assign a wheel-rail systematic three-dimensional model corresponding to the target train according to the train load spectrum, to perform load application simulation to obtain a stress spectrum of a rim of the target train that matches the preset mileage. The sample function parameter determination module is configured to determine target stress and stress application frequency corresponding to expected simulation mileage to be acted on a wheel-rail steel fatigue sample of the target train according to the stress spectrum of the dangerous part of the rim. The equivalent fatigue test driving module is configured to drive a fatigue test machine to initiate a fatigue test on the wheel-rail steel fatigue sample according to the determined target stress and stress application frequency, to obtain wheel-rail steel equivalent fatigue damage data of the target train serving for the expected simulation mileage.

In an alternative implementation, the train load spectrum acquisition module comprises a load value calculation sub-module, a load frequency calculation sub-module. The load value calculation sub-module is configured to calculate a load value of the load in first level among the loads in different levels corresponding to the target train in the train load spectrum according to a wheelset weight and train axle load of the target train. The load frequency calculation sub-module is configured to calculate the occurrence frequency of the load in first level during a service process of the preset mileage according to the possibility the load in first level occurs during the service process of the preset mileage and the possibility the loads in different levels occurs during the service process of the target train. The load value calculation sub-module is further configured to calculate respective load values of the loads in different levels based on the load value of a load in first level, according to a preset load ratio among the loads in different levels. The load frequency calculation sub-module is further configured to calculate frequencies of the respective loads in different levels based on the loads in first level, according to a preset frequency ratio among the loads in different levels.

In an alternative implementation, the rim stress spectrum simulation module comprises a wheel-rail contact simulation sub-module and a stress arrangement output sub-module. The wheel-rail contact simulation sub-module is configured to apply, respectively according to a corresponding load occurrence frequency, the loads in different levels corresponding to the train load spectrum on the wheel-rail systematic three-dimensional model to perform wheel-rail system static contact mechanical behavioral simulation, in order to obtain a rim danger stress and stress occurrence frequency of a dangerous part of rim of a target train based on loads in different levels. The stress arrangement output sub-module is configured to perform data arrangement upon respective corresponding rim danger stresses and stress occurrence frequencies of the loads in different levels corresponding to the train load spectrum, to obtain the stress spectrum of the dangerous part of the rim.

In an alternative implementation, the sample function parameter determination module comprises a stress occurrence frequency sorting sub-module, a stress frequency distribution calculating sub-module, a sample action stress determination sub-module, and an action stress frequency determination sub-module. The stress occurrence frequency sorting sub-module is configured to perform a descending sorting process on respective stress occurrence frequencies of all rim danger stresses in the stress spectrum of the dangerous part of the rim, to obtain a corresponding stress frequency sorting result. The stress frequency distribution calculating sub-module is configured to perform division operation upon the stress occurrence frequency of the rim danger stress and the preset mileage for each kind of rim danger stress in the stress spectrum of the dangerous part of the rim, to obtain the occurrence frequency of the rim danger stress in a unit mileage of the target train service process. The sample action stress determination sub-module is configured to select at least one rim danger stress ranked highest among the stress frequency sorting results from the stress spectrum of the dangerous part of the rim as the target stress. The action stress frequency determination sub-module is configured to perform, for each target stress, multiplication operation upon an occurrence frequency in the unit mileage of the target stress and the expected simulation mileage, to obtain the stress application frequency of the target stress.

In a third aspect, the present application provides a calculation device that comprises a processor and a memory, wherein the memory stores a calculation process executable by the processor, and the processor executes the calculation process to perform the wheel-rail steel equivalent fatigue damage simulation method according to any of the aforementioned embodiments.

In a fourth aspect, the present application provides a readable storage medium storing a calculation process, wherein the calculation process is executed by a processor to perform the wheel-rail steel equivalent fatigue damage simulation method according to any of the above embodiments.

In view of the above, the embodiments of the present application may provide benefits as follows.

After obtaining the train load spectrum of the target train serving for a preset mileage, the present application will select a wheel-rail systematic three-dimensional model corresponding to the target train according to train load spectrum to perform load application simulation, so as to obtain stress spectrum of the dangerous part of the rim of the target train. Next, the target stress and stress application frequency corresponding to the expected simulation mileage to be applied to the wheel-rail steel fatigue sample of the target train according to the stress spectrum of the dangerous part of the rim, thereby driving the fatigue test machine to initiate the fatigue test on the wheel-rail steel fatigue sample according to determined target stress and stress application frequency, to obtain the wheel-rail steel equivalent fatigue damage data when the target train has served for the expected simulation mileage, so as to simply and quickly complete the equivalent simulation test for the actual fatigue damages of wheel-rail steel in the train service process, to facilitate the instant initiation of subsequent wheel-rail operations and maintenance operations.

In order to make the above-mentioned purposes, features and advantages of the present application more obvious and easier to understand, details are described as follows using preferred embodiments and accompanied drawings.

BRIEF DESCRIPTION OF THE DRAWINGS

In order to illustrate the technical solution of the embodiment of the present application more clearly, the following will briefly introduce the drawings to be used in the embodiment. It should be understood that the following drawings only show some embodiments of the present application, and therefore do not be regarded as a limitation of the scope of the present invention. To those skilled in the art, other related drawings may be obtained according to these drawings without any creative effort.

FIG. 3 is a schematic flow chart of the wheel-rail steel equivalent fatigue damage simulation method according to the embodiment of the present application;

FIG. 4 is a schematic diagram corresponding to served preset mileage according to an embodiment of the present application;

FIG. 7 is a schematic flowchart of Sub-steps included in Step S220 in FIG. 3;

FIG. 8 is a schematic flowchart of Sub-steps included in Step S230 in FIG. 3;

FIG. 9 is a schematic diagram of the components of the wheel-rail steel equivalent fatigue damage simulation device according to an embodiment of the present application;

DETAILED DESCRIPTION OF PREFERRED EMBODIMENTS

Figure 1:
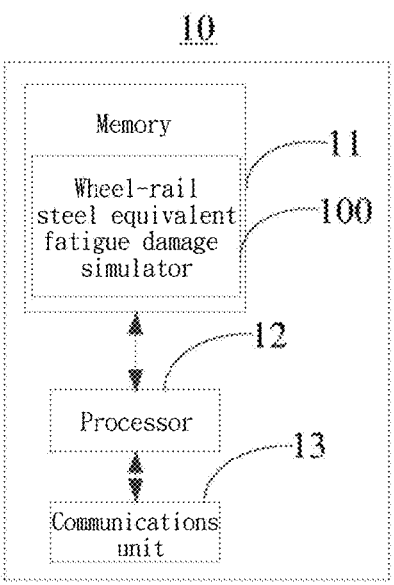
FIG. 1 is a schematic diagram of the composition of a computing device provided by an embodiment of the present application.

In order to make the objectives, technical solutions and advantages of the embodiments of the present application clearer, embodiments are accompanied by drawings to clearly and thoroughly describe the technical solutions of the present application. Obviously, the presented embodiments are merely a part rather than all of the present application. In general, the components of the embodiment of the present application described and shown in the figures herein may be arranged and designed in a variety of different configurations.

Accordingly, the following detailed description of the embodiment of the present application provided in the accompanying drawings is not intended to limit the claimed scope of the present application, but merely to represent selected embodiments of the present application. Based on the embodiments of the present application, all other embodiments obtained by one skilled in the art without creative work shall fall into the claimed scope of the present application.

It should be noted that similar symbols and letters indicate similar items in the following drawings, so once an item is defined in one drawing, it does not need to be further defined and explained in subsequent drawings.

In the description of the present application, it should be understood that the orientation or positional relationships indicated by the terms "center", "upper", "lower", "left", "right", "vertical", "horizontal", "inside" and "outside" are based on the orientation or positional relationship shown in the drawings, how the product is generally placed, or understood by those skilled in the art. However, the afore-mentioned orientation or positional relationships are merely for convenience of describing the present application and to simplify the description, rather than indicating or implying that the equipment or element referred to must have a particular orientation, or be constructed and operated in a particular orientation. Therefore, these terms should not be taken as a limitation of the present application.

In the description of the present application, it may also be understood that the relational terms such as "first" and "second" are used only to distinguish one entity or operation from another, rather than definitely demanding or implying there must be a particular relationship or operation order among these entities or operations. Moreover, the term "comprising", "including" or any other variation thereof is intended to cover a non-exclusive inclusion, so that a process, method, article or equipment that includes a series of elements not only includes those elements, but also includes other elements not explicitly listed, or also includes elements inherent to such process, method, article or equipment. Without further restrictions, an element defined by the statement "includes one . . . " does not exclude the existence of another identical element in the process, method, article or equipment that includes the said element. For those skilled in the art, the specific meanings of the above terms in the present application may be understood in specific situations.

Through carefully studying, the applicant found that the existing methods for measuring rolling contact fatigue damages of train mainly include the following issues:

(1) Theoretical analysis and realization based on the assumption of linear elastic materials often cannot reflect the plastic deformation of wheel-rail materials in the service process of trains, and thus cannot effectively represent the fatigue damage parameters of wheel-rail systems; (2) It is often difficult to reflect the actual contact state of wheel-rail by directly using finite element simulation technology to simulate the propagation law of wheel-rail rolling contact fatigue crack during train service; (3) When directly constructing the wheel structure of the rail and train under the wheel-rail system and using the wheel structure to reciprocate on the rail to simulate the wheel-rail rolling contact behavior, often due to factors such as the oversized wheel and rail, narrow test space, limited rail reciprocating frequency and wheel rolling speed, etc., it is difficult or takes long for the whole test process to be realized, which cannot effectively simulate the fatigue damage of the wheel-rail material when the train serves for a certain mileage. Hence, it is inconvenient to complete the assessment of the actual fatigue damage of the wheel-rail material.

Therefore, by developing a simulation method, device, computer equipment and readable storage medium for equivalent fatigue damage of wheel-rail steel, the applicant may easily and instantly conduct an equivalent simulation test for the actual fatigue damage of wheel-rail steel in the service process of trains, so as to effectively evaluate the equivalent damage relationship between wheel-rail materials and train service mileage, and facilitate the instant initiation of subsequent wheel-rail operation and maintenance operations.

Some embodiments of the present application will be described in detail with reference to the following drawings. If without conflict, the following embodiments and features in the embodiments may be mutually combined.

Please refer to FIG. 1, which is a schematic diagram of a computing device 10 provided by an embodiment of the present application. In this embodiment, the computing device 10 may simulate the static contact mechanical behavior of the wheel-rail system during the preset mileage service of the target train, and then transform the simulation result into the equivalent fatigue test of the expected mileage of the wheel-rail steel fatigue sample of the wheel-rail system where the target train is located, so as to easily and instantly conduct the equivalent simulation test for the actual fatigue damage of the wheel-rail steel during the service of the train, effectively evaluate the equivalent damage relationship between the wheel-rail materials and the service mileage of the train, and facilitate the instant initiation of the subsequent wheel-rail operation and maintenance. The wheel-rail steel fatigue test sample is a bar-shaped test sample cut from the wheel rim and rail top of the wheel-rail system where the target train is located, and the expected simulated mileage may be less than, equal to or greater than the preset mileage.

In this embodiment, the computing device 10 may include a memory 11, a processor 12, a communications unit 13, and a wheel-rail steel equivalent fatigue damage simulator 100. The memory 11, the processor 12 and the communications unit 13 are electrically connected to one another in a direct or indirect manner, to realize data transmission or interaction. For example, the memory 11, the processor 12 and the communications unit 13 may be electrically connected to one another through one or more communications buses or signal lines.

In this embodiment, the memory 11 may be, but is not limited to, a random access memory (RAM), read-only memory (ROM), programmable read-only memory (PROM), erasable programmable read-only memory (EPROM), electrically erasable programmable read-only memory (EEPROM), etc. The memory 11 is used to store computer programs, and the processor 12 may execute the computer programs accordingly after receiving the execution instructions.

Figure 2:
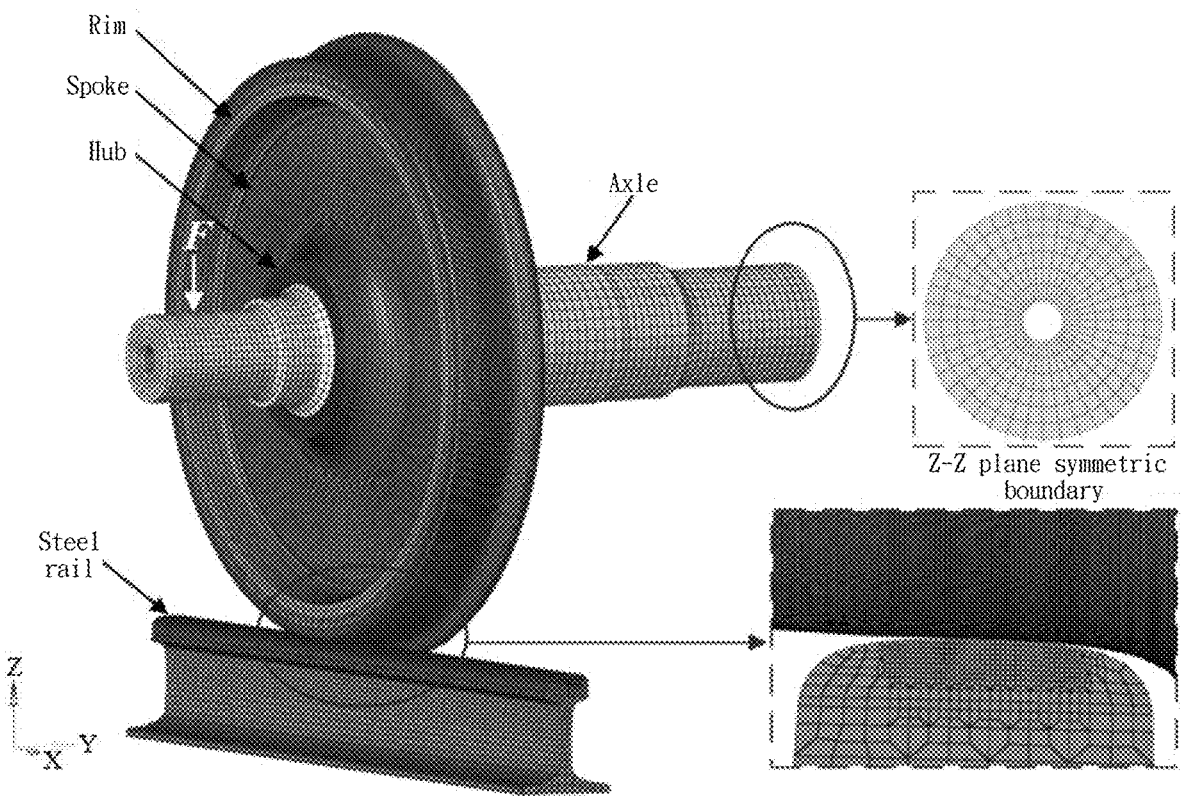
FIG. 2 is a schematic diagram of a model of the wheel-rail systematic three-dimensional model according to an embodiment of the present application.

The memory 11 may also store a three-dimensional model of the wheel-rail system matched with the wheel-rail system where the target train is located, wherein the wheel-rail systematic three-dimensional model is used to simulate the wheel-rail contact conditions of the wheel-rail system where the target train is located during the service of the train. Please refer to FIG. 2 which is a schematic diagram of a model of the wheel-rail systematic three-dimensional model. The wheel structure corresponding to the wheel-rail system may include an axle, hub, spoke and rim. The hub is sleeved on the axle, the spoke is sleeved on the hub, and the rim is sleeved on the spoke. The outer side surface of the rim is in contact with the rail top surface of the rail corresponding to the wheel-rail system. The vertical section in the middle of the axle of the wheel structure is a symmetrical plane. The construction process of the wheel-rail systematic three-dimensional model may include: obtaining the respective component material parameters of each component structure (including the axle, hub, spoke, rim and rail) in the wheel-rail system of the target train, wherein the component material parameters may be obtained by mechanical performance test on the corresponding component structure; creating a three-dimensional finite element model corresponding to the wheel-rail system of the target train; loading the wheel-rail contact constraint conditions that conform to the static contact mechanics of the wheel-rail system and the obtained material parameters of all components into the three-dimensional finite element model to obtain the wheel-rail systematic three-dimensional model corresponding to the target train.

In this embodiment, the processor 12 may be an integrated circuit chip with signal processing capability. The processor 12 may be a general-purpose processor, including at least one of a central processing unit (CPU), graphics processing unit (GPU) and a network processor (NP), digital signal processor (DSP), application specific integrated circuit (ASIC), field programmable gate array (FPGA) or other programmable logic devices, discrete gates or transistor logic devices, and discrete hardware components. The general-purpose processor may be a microprocessor or any kind of conventional processor, etc., and may implement or execute the methods, steps and logic diagrams disclosed in the embodiments of the present application.

In this embodiment, the communications unit 13 is used to establish a communications connection between the computing device 10 and other electronic devices through a network, and to send and receive data through the network, wherein the network includes a wired communications network and a wireless communications network. For example, the computing device 10 may control the fatigue test machine through the communications unit 13 to perform fatigue tests on the corresponding wheel-rail steel fatigue samples, so as to simulate the equivalent fatigue damage of the wheel-rail steel when the target train serves for a specific mileage.

In this embodiment, the wheel-rail steel equivalent fatigue damage simulation device 100 includes at least one software function module that may be stored in the memory 11 in the form of software or firmware, or solidified in the operating system of the computing device 10. The processor 12 may be used to execute executable modules stored in the memory 11, such as software functional modules and computer programs included in the wheel-rail steel equivalent fatigue damage simulation device 100. The computing device 10 may easily and instantly carry out equivalent simulation tests on the actual fatigue damage of wheel-rail steel in the service process of trains through the equivalent fatigue damage simulation device 100, so as to effectively evaluate the equivalent damage relationship between wheel-rail materials and the service mileage of trains, and facilitate the instant initiation of subsequent wheel-rail operation and maintenance operations.

It may be understood that the block diagram shown in FIG. 1 is only a schematic diagram of the components of the computing device 10. The computing device 10 may also include more or fewer components than those shown in FIG. 1, or have a different configuration from that shown in FIG. 1. The components shown in FIG. 1 may be implemented by hardware, software or combinations thereof.

In the present application, in order to ensure that the computing device 10 may easily and instantly carry out equivalent simulation tests on the actual fatigue damage of wheel-rail steel in the service process of trains, and facilitate the instant initiation of subsequent wheel-rail operation and maintenance. The embodiment of the present application provides a simulation method for equivalent fatigue damage of wheel-rail steel to achieve the above purpose. The simulation method of equivalent fatigue damage of wheel-rail steel provided in the present application is described in detail below.

Please refer to FIG. 3, which is a schematic flow chart of the wheel-rail steel equivalent fatigue damage simulation method according to the embodiment of the present application. In the embodiment of the present application, the method for simulating the equivalent fatigue damage of wheel-rail steel may include steps S210 to S240.

Step S210: Acquire a train load spectrum of a target train serving for a preset mileage.

In this embodiment, the train load spectrum records the respective load values and load occurrence frequencies of a plurality of loads in different levels vertically acting on the axle of the target train in the service process according to the preset mileage, wherein the load occurrence frequency is positively correlated with the value of the preset mileage, and the load value of the load in first level in the train load spectrum is obtained according to the UIC 510-5 and BS EN 13979 standards, so as to ensure that the train load spectrum may effectively represent the train load distribution state of the target train serving for the preset mileage.

Alternatively, please refer to FIG. 4, which is a schematic diagram corresponding to served preset mileage according to an embodiment of the present application. In one implementation of this embodiment, the CRH3A electric multiple unit (EMU) is taken as the target train and 300,000 km are taken as the preset mileage, and the corresponding train load spectrum involves eight levels of loads, in which the load value of Load $n_1$ in first level is about 110.64 kN, and the load frequency of Load $n_1$ in first level is 105 times. The respective load values and load occurrence frequencies of the other seven levels of loads (including Loads $n_2$, $n_3$, $n_4$, $n_5$, $n_6$, $n_7$, and $n_8$) are shown in the figure, so as to characterize the train load distribution of CRH3A EMU in the service process of 300,000 km through the train load spectrum shown in FIG. 4.

Figure 5:
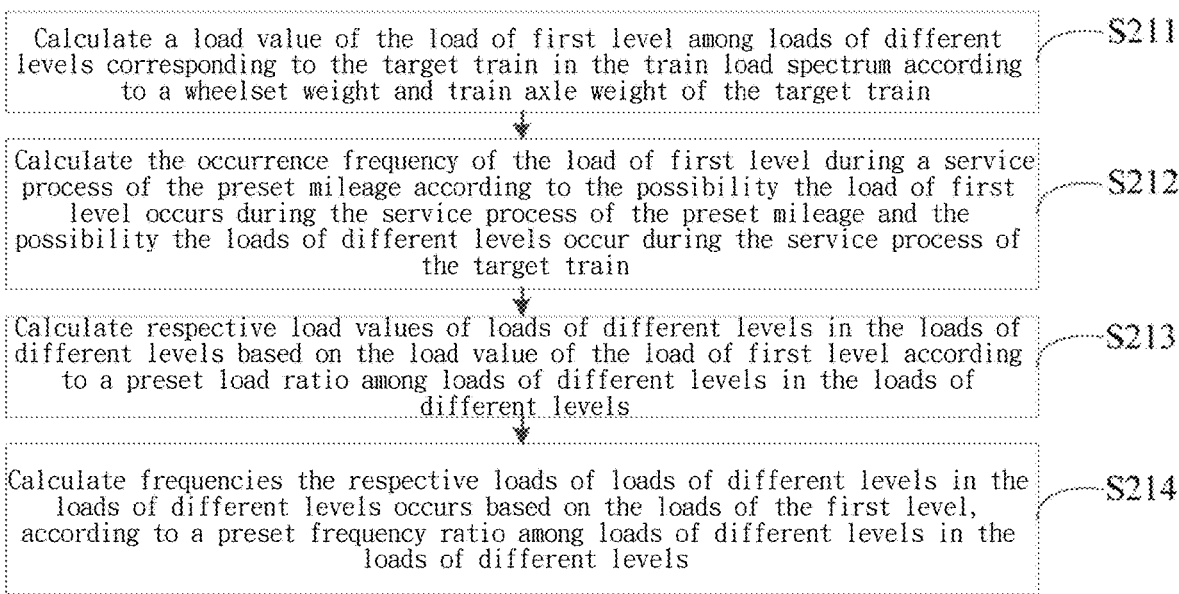
FIG. 5 is a schematic flowchart of the Sub-steps included in Step S210 in FIG. 3.

Alternatively, please refer to FIG. 5, which is a schematic flowchart of the Sub-steps included in Step S210 in FIG. 3. In this embodiment, the step S210 may include Sub-steps S211 to S214.

Step S211: Calculate a load value of the load in first level among the loads in different levels corresponding to the target train in the train load spectrum according to a wheelset weight and train axle load of the target train.

In this embodiment, the computing device 10 may determine that the equivalent vertical force shared by different operating conditions is to be used as the load in first level of the corresponding to the train by selecting the equation of the equivalent load on the train wheels under different operating conditions (such as straightway, curves and turnouts) expressed by the UIC 510-5 and BS EN13979 standards, so that the computing device 10 may substitute the wheelset weight and axle load of the target train into the equation of the equivalent vertical force. Meanwhile, the specific equation of the load value of the load in first level of the target train is as follows:

$$F=1.25(P+P_0)g/2;$$

F denotes the load value of the load in first level of the target train, P denotes the train axle load of the target train, $P_0$ denotes the wheelset weight of the target train, and g denotes the gravitational acceleration. Taking the CRH3A EMU as an example, the axle load of the train is 17 t, the weight of the wheelset weight is 1064 kg, and the load value of the EMU's load in first level is 110.64 kN.

Step S212: Calculate the occurrence frequency of the load in first level during a service process of the preset mileage according to the possibility the load in first level occurs during the service process of the preset mileage and the possibility the loads in different levels occur during the service process of the target train.

In this embodiment, the occurrence frequency of the loads in different levels in the service process of the target train is used to represent the total frequency of the loads in different levels involved in the target train.

The occurrence frequency of the loads in different levels in the target train service process is used to represent the total occurrence frequency of the multiple levels involved by the target train.

Meanwhile, the total frequency of the loads in multiple levels in the service process of the target train may be obtained by multiplying the frequency of the loads in different levels with the preset mileage, and the total frequency of the loads in different levels in the service process of the preset mileage may be multiplied by the probability of the load in first level in the service process of the preset mileage. Taking CRH3A EMU as an example, the occurrence frequency of the load in eight levels of the train is 350 times/km, and the occurrence probability of the load in first level is $1\times10^{-6}$. Given that the preset mileage is 300,000 km, and the total occurrence frequency of the eight-level load is $1.05\times10^8$, then the occurrence frequency of the load in first level is 105 times.

Sub-step S213: Calculate respective load values of loads in different levels based on the load value of the load in first level according to a preset load ratio among the loads in different levels.

In this embodiment, the computing device 10 stores a preset load ratios between loads in different levels of the same train, wherein the preset load ratios between loads in different levels are used to represent numerical ratios between load values of loads in different levels. In an implementation of this embodiment, the preset load ratio between the loads in different levels may be described in the form of the preset load value ratio between all levels of loads in different levels and the first level load. Taking the eight loads of CRH3A EMU as an example, the preset load-value ratios between the first load, the second load, the third load, the fourth load, the fifth load, the sixth load, the seventh load and the eighth load and the first load are respectively expressed as 1, 0.95, 0.85, 0.725, 0.575, 0.425, 0.275, and 0.125.

Meanwhile, the computing device 10 may calculate the load values of the loads in different levels on the basis of the calculated load values of the load in first level and the preset load ratios among the loads in different levels.

Sub-step S214: Calculate frequencies of the respective loads of loads in different levels based on the loads in first level, according to a preset frequency ratio among the loads in different levels.

In this embodiment, the computing device 10 stores the preset frequency ratio between loads in different levels of the same train, wherein the preset frequency ratio between loads in different levels is used to represent the numerical ratio between the load occurrence frequencies of loads in different levels under the same mileage. In an implementation of this embodiment, the preset frequency ratio between all the load levels and the first load level may be used to describe the preset frequency ratio between different load levels in the loads in different levels. Taking the eight loads of CRH3A EMU as an example, the preset frequency ratios between the first load, the second load, the third load, the fourth load, the fifth load, the sixth load, the seventh load and the eighth load and the first load are respectively expressed as 1, 106, 6834, 174620, 611563, 201936, 4927, and 13.

Meanwhile, the computing device 10 may calculate the load occurrence frequencies of the loads in different levels on the basis of the calculated load occurrence frequencies of the load in first level in the service process of preset mileage, combined with the preset frequency ratio among the loads in different levels.

Therefore, the present application may determine the train load distribution state of the target train in the service preset mileage process by executing the above Sub-steps S211 to S214.

Step S220: Assign a wheel-rail systematic three-dimensional model corresponding to the target train according to the train load spectrum, to perform load application simulation to obtain a stress spectrum of a dangerous part of a rim of the target train that matches the preset mileage.

In this embodiment, after the computer equipment 10 determines the train load spectrum corresponding to the target serving for a t a preset mileage, it obtains the wheel-rail systematic three-dimensional model corresponding to the target train, and vertically applies the load values of loads in different levels represented by the train load spectrum to the two ends of the axle of the wheel-rail systematic three-dimensional model according to the corresponding load occurrence frequency to simulate the wheel-rail contact behavior. Thereby, the stress distribution of the wheel-rail system during the preset mileage of the target train can be obtained, and Von Mises stress of the dangerous part of the rim in the wheel-rail contact area (i.e., the part prone to crack) can be selected as the dangerous stress of the target train under the corresponding load level, and then the stress spectrum of the dangerous part of the rim matching the preset mileage of the target train synchronously is constructed according to the load occurrence frequency. The stress occurrence frequencies of different rim danger stress in the stress spectrum of the rim dangerous parts are different from one another, and the stress occurrence frequency of each rim danger stress is consistent with the load occurrence frequency of the corresponding applied level load.

Figure 6:
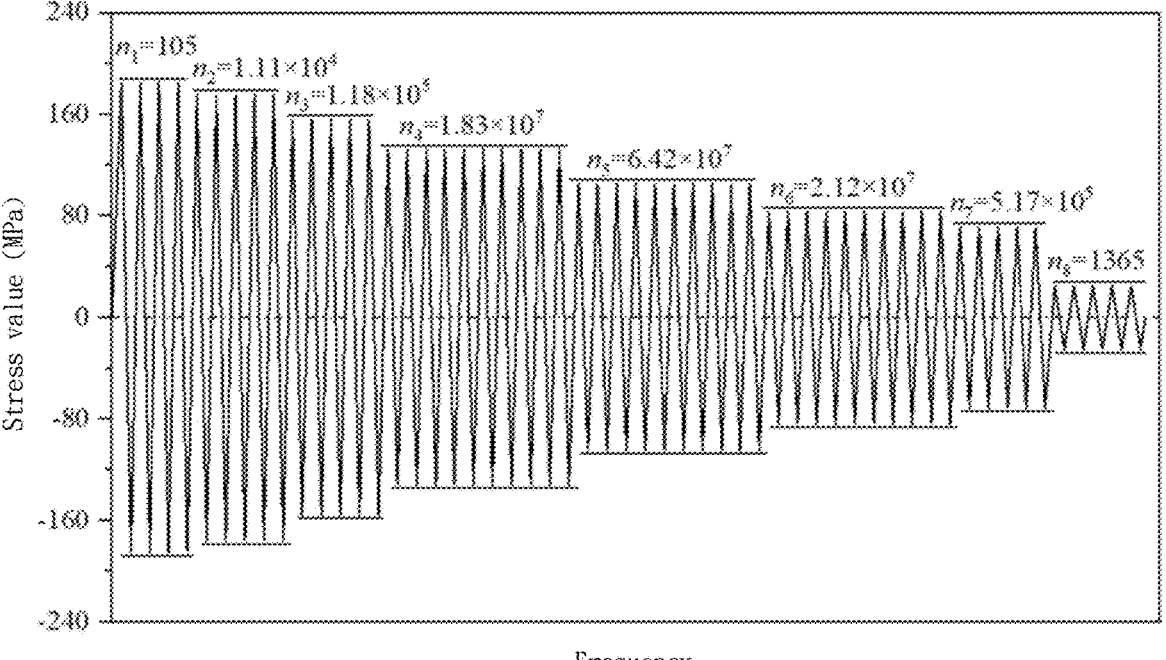
FIG. 6 is a schematic diagram of a stress spectrum of the dangerous part of the rim corresponding to served preset mileage according to the embodiment of the present application.

Alternatively, please refer to FIG. 6, which is a schematic diagram of a stress spectrum of the dangerous part of the rim corresponding to served preset mileage according to the embodiment of the present application. In one implementation of this embodiment, CRH3A EMU is taken as the target train and 300,000 km are taken as the preset mileage, and the corresponding train load spectrum is shown in FIG. 4, so that the stress occurrence frequency of the rim danger stress (also marked as $n_1$) corresponding to the first-level Load $n_1$ in the stress spectrum of the corresponding rim dangerous position is consistent with that of the first-level Load $n_1$, and the stress occurrence frequency of other kinds of rim danger stresses is consistent with that of the corresponding level load.

Alternatively, please refer to FIG. 7, which is a schematic flowchart of Sub-steps included in Step S220 in FIG. 3. In this embodiment, the step S220 may include Sub-steps S221 to S222.

Sub-step S221: Apply each of loads in different levels corresponding to the train load spectrum on the wheel-rail systematic three-dimensional model according to respective load occurrence frequencies, to perform static contact mechanical behavioral simulation on the wheel-rail system, in order to obtain a rim danger stress and stress occurrence frequency of the dangerous part of rim of the target train based on each of the loads in different levels.

In this embodiment, taking CRH3A EMU as an example, the diameter of the wheel structure constructed in the corresponding three-dimensional model of the wheel-rail system is 860 mm, the total length of the axle is 2180 mm, and the rail cant is 1:40, which ensures that the elastic modulus of the rim material is 213 GPa, the material density of the rim material is 7800 kg/m³, the yield strength of the rim material is 561 GPa, and the tangent modulus of the rim material is 21 GPa. The Poisson's ratio of rim material is 0.3, which ensures that the elastic modulus of spoke material is 216 GPa, the material density of spoke material is 7,800 kg/m³, the yield strength of spoke material is 395 GPa, the tangent modulus of spoke material is 21 GPa, the Poisson's ratio of spoke material is 0.3, and the elastic modulus of hub material is 213 GPa and the material density of hub material is 7,800 kg/m³. The yield strength of the hub material is 417 GPa, the tangent modulus of the hub material is 21 GPa, the Poisson's ratio of the hub material is 0.3, the elastic modulus of the axle material is 206 GPa, the material density of the axle material is 7800 kg/m³, the yield strength of the axle material is 560 GPa, the tangent modulus of the axle material is 20 GPa, the Poisson's ratio of the axle material is 0.3, and the elastic modulus of the rail material is 193 GPa. The material density of the rail is 7800 kg/m³, the yield strength of the rail is 525 GPa, the tangent modulus of the rail is 18 GPa, and the Poisson's ratio of the rail is 0.3. Thereby, the ANAYS implicit finite element algorithm is used to simulate the static contact mechanical behavior of the wheel-rail system under different loads on the wheel-rail systematic three-dimensional model. In this way, the stress distribution of wheel-rail system under loads in different levels (including the specific values and stress occurrence frequency of different stresses at the same position) can be obtained, and then the position 15 mm below the tread of the rim as the rim dangerous position, and get the rim danger stress and stress occurrence frequency of the rim dangerous position under loads in different levels matching the preset mileage can be selected.

Sub-step S222: Perform data arrangement upon rim danger stresses and stress occurrence frequencies respectively corresponding to the loads in different levels corresponding to the train load spectrum, to obtain the stress spectrum of the dangerous part of the rim.

Therefore, the present application may determine the stress distribution of the dangerous part of the rim of the target train in the service process according to the preset mileage by executing the above Sub-steps S221 to S222.

Step S230: Determine a target stress and a stress application frequency corresponding to the expected simulation mileage to be acted on a wheel-rail steel fatigue sample of the target train according to the stress spectrum of the dangerous part of the rim.

In this embodiment, when the computing device 10 determines the stress spectrum of the rim dangerous part when the target train serves for the preset mileage, it obtains the specific stress values of different rim danger stresses related to wheel-rail rolling behavior in the service process of the target train, and the contribution of different rim dangerous parts stresses in the process of forming wheel-rail steel fatigue damage. Meanwhile, the computing device 10 may correspondingly select the stress value and stress application frequency of the appropriate target stress from the stress spectrum of the dangerous part of the rim and transfer it to the fatigue test process of the wheel-rail steel sample of the target train that meets the expected simulated mileage effect, so as to instantly obtain the actual fatigue damage state of the wheel-rail steel in the service process of the train through the equivalent fatigue test that meets the expected simulated mileage effect. In this process, the stress application frequency of the target stress should be determined by referring to the occurrence frequency of the target stress in the stress spectrum of the dangerous part of the rim.

Alternatively, please refer to FIG. 8, which is a schematic flowchart of Sub-steps included in Step S230 in FIG. 3. In this embodiment, the step S230 may include Sub-steps S231 to S234.

Sub-step S231: Sort respective stress occurrence frequencies of all rim danger stresses in the stress spectrum of the dangerous part of the rim in a descending order, to obtain a corresponding stress-frequency sorting result;

Sub-step S232: Perform division operation upon the stress occurrence frequency and the preset mileage of the rim danger stress for each kind of rim danger stresses in the stress spectrum of the dangerous part of the rim, to obtain the occurrence frequency in the unit mileage of the rim danger stress during the service process of the target train.

Sub-step S233: Select at least one wheel rim danger stress with the highest ranking among the stress spectrum of the dangerous part of the rim as the target stress.

In this embodiment, the higher the stress frequency ranks, the greater the contribution of the rim danger stress in the fatigue damage formation process of wheel-rail steel, and the stress occurrence frequency (i.e. damage formation contribution) of the selected rim danger stress in the stress spectrum of the rim dangerous position is greater than that of the unselected rim danger stress. The computing device 10 may participate in the equivalent fatigue test by selecting one or more rim danger stresses with the most important contribution.

In one implementation of this embodiment, the computing device 10 may only select the highest ranked rim danger stress in the stress frequency ranking results as the target stress, so as to facilitate the instant initiation of the subsequent equivalent fatigue test and effectively shorten the test duration of the subsequent equivalent fatigue tests.

Step S234: Perform multiplication operation upon the occurrence frequency in the unit mileage and the expected simulation mileage for each target stress, to obtain the stress application frequency of the target stress.

In this embodiment, after the computing device 10 selects the appropriate target stress from the stress spectrum of the rim dangerous part when the target train serves for a preset mileage, it will determine the stress application frequency of the target stress when it meets the expected simulated mileage effect according to the occurrence frequency of the target stress in the stress spectrum of the rim dangerous part per unit mileage and the expected simulation.

Taking the CRH3A EMU's second-level overhaul period of 20,000 km as the expected simulated mileage, and taking the dangerous stress of the rim corresponding to the most frequent fifth-level load in 300,000 km in FIG. 6 as an example, the stress application frequency of the dangerous part of the rim within 20,000 km is $4.28 \times 10^6$.

Therefore, the present application may effectively determine the force parameters to be acted on the wheel-rail steel fatigue sample of the target train, which are suitable for the equivalent fatigue test of the expected simulated mileage, by executing the above Sub-steps S231 to S234.

Step S240: Drive a fatigue test machine to initiate a fatigue test on the wheel-rail steel fatigue sample according to the determined target stress and stress application frequency, to obtain wheel-rail steel equivalent fatigue damage data of the target train serving for the expected simulation mileage.

In this embodiment, when the computing device 10 determines at least one target stress corresponding to the expected simulated mileage that needs to act on the wheel-rail steel fatigue sample of the target train from the stress spectrum of the dangerous part of the rim, and the stress application frequency of each target stress that matches the expected simulated mileage.

The driving fatigue test machine may applies the target stress to the wheel-rail steel fatigue sample according to the stress application frequency corresponding to the target stress for each determined target stress, and scans the wheel-rail steel fatigue sample with CT scanning equipment in full gauge range before and after the present application of the target stress, so as to determine the information such as the internal pore number, pore volume and pore distribution law of the wheel-rail steel fatigue sample before and after the present application of the target stress.

Then, for each target stress, the computing device 10 will calculate the porosity change value of the wheel-rail steel fatigue sample under the action of the target stress according to the total pore volume of the wheel-rail steel fatigue sample before and after the target stress is applied, and take it as the equivalent fatigue damage of the wheel-rail steel corresponding to the target stress when the target train is expected to serve for the simulated mileage, wherein the ratio of the total pore volume in the same sample to the sample volume is the porosity.

Therefore, by executing the above steps S210-S240, the present application may easily and instantly carry out the equivalent simulation test for the actual fatigue damage of the wheel-rail steel in the service process of the train, so as to effectively evaluate the equivalent damage relationship between the wheel-rail materials and the service mileage of the train, and facilitate the instant initiation of the subsequent wheel-rail operation and maintenance works.

In the present application, in order to ensure that the computing device 10 may implement the above-mentioned wheel-rail steel equivalent fatigue damage simulation method through the wheel-rail steel equivalent fatigue damage simulation device 100, the present application realizes the above-mentioned functions by dividing the function modules of the wheel-rail steel equivalent fatigue damage simulation device 100. The specific composition of the simulation device 100 for equivalent fatigue damage of wheel-rail steel provided in the present application is described as follows.

Please refer to FIG. 9, which is a schematic diagram of the components of the wheel-rail steel equivalent fatigue damage simulation device 100 according to an embodiment of the present application. In the embodiment of the present application, the wheel-rail steel equivalent fatigue damage simulation device 100 may include a train load spectrum acquisition module 110, a rim stress spectrum simulation module 120, a sample action parameter determination module 130, and an equivalent fatigue test driving module 140.

The train load spectrum acquisition module 110 is configured to acquire a train load spectrum of a target train serving for a preset mileage.

The rim stress spectrum simulation module 120 is configured to assign a wheel-rail systematic three-dimensional model corresponding to the target train according to the train load spectrum, to perform load application simulation to obtain a stress spectrum of a dangerous part of a rim of the target train that matches the preset mileage.

The sample function parameter determination module 130 is configured to determine a target stress and a stress application frequency corresponding to expected simulation mileage to be acted on a wheel-rail steel fatigue sample of the target train according to the stress spectrum of the dangerous part of the rim.

The equivalent fatigue test driving module 140 is configured to drive a fatigue test machine to initiate a fatigue test on the wheel-rail steel fatigue sample according to the determined target stress and stress application frequency, so as to obtain the wheel-rail steel equivalent fatigue damage data of the target train serving for the expected simulation mileage.

Figure 10:
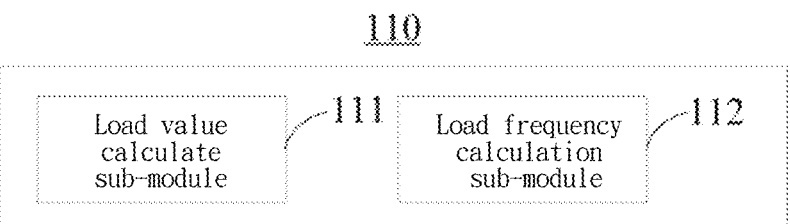
FIG. 10 is a schematic diagram of the composition of the train load spectrum acquisition module in FIG. 9.

Alternatively, please refer to FIG. 10, which is a schematic diagram of the composition of the train load spectrum acquisition module 110 shown in FIG. 9. In the embodiment of the present application, the train load spectrum acquisition module 110 may include a load value calculation sub-module 111 and a load frequency calculation sub-module 112.

The load value calculation sub-module 111 is used to calculate the load value in first level load of the target train among the multiple levels of loads corresponding to the train load spectrum according to the wheelset weight and axle load of the target train.

The frequency calculation sub-module 112 is used to calculate the load occurrence frequency of the load in first level in the service process of the preset mileage according to the occurrence probability of the load in first level in the service process of the preset mileage and the occurrence frequency of the loads in different levels in the service process of the target train.

The load value calculation sub-module 111 is further configured to calculate the respective load values of loads in different levels based on the load values of the load in first level according to the preset load ratio among loads in different levels.

The load frequency calculation sub-module 112 is further configured to calculate the load occurrence frequencies of loads in different levels based on the load occurrence frequency of the load in first level according to the preset frequency ratio among loads in different levels.

Figure 11:
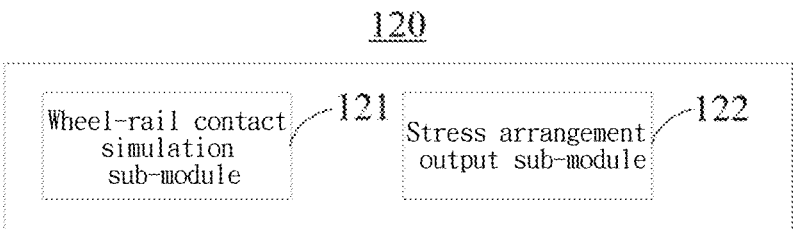
FIG. 11 is a schematic diagram of the composition of the rim stress spectrum simulation module in FIG. 9.

Alternatively, please refer to FIG. 11, which is a schematic diagram of the composition of the rim stress spectrum simulation module 120 in FIG. 9. In the embodiment of the present application, the rim stress spectrum simulation module 120 may include a wheel-rail contact simulation sub-module 121 and a stress sorting output sub-module 122.

The wheel-rail contact simulation sub-module 121 is configured to apply, respectively according to a corresponding load occurrence frequency, the loads in different levels corresponding to the train load spectrum on the wheel-rail systematic three-dimensional model to perform wheel-rail system static contact mechanical behavioral simulation, in order to obtain a rim danger stress and stress occurrence frequency of a dangerous part of rim of a target train based on loads in different levels.

The stress arrangement output sub-module 122 is configured to perform data arrangement upon respective corresponding rim danger stresses and stress occurrence frequencies of the loads in different levels corresponding to the train load spectrum, to obtain the stress spectrum of the dangerous part of the rim.

Figure 12:
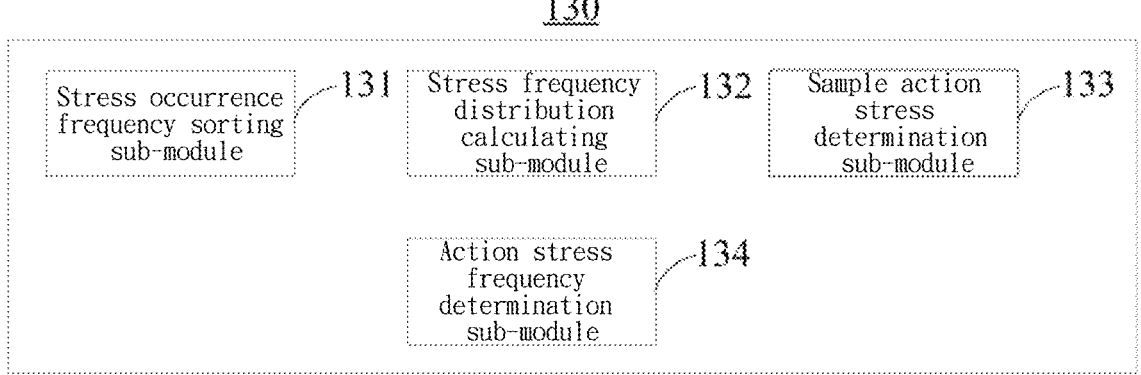
FIG. 12 is a schematic diagram of the composition of the sample function parameter determination module in FIG. 9.

Alternatively, please refer to FIG. 12, which is a schematic diagram of the composition of the sample function parameter determination module 130 shown in FIG. 9. In the embodiment of the present application, the sample action parameter determination module 130 may include a stress occurrence frequency sorting sub-module 131, a stress frequency distribution calculation sub-module 132, a sample action stress determination sub-module 133 and an action stress frequency determination sub-module 134.

The stress occurrence frequency sorting sub-module 131 is configured to perform a descending sorting process on respective stress occurrence frequencies of all rim danger stresses in the stress spectrum of the dangerous part of the rim, to obtain a corresponding stress frequency sorting result.

The stress frequency distribution calculating sub-module 132 is configured to perform division operation upon the stress occurrence frequency of the rim danger stress and the preset mileage for each kind of rim danger stress in the stress spectrum of the dangerous part of the rim, to obtain the occurrence frequency of the rim danger stress in a unit mileage of the target train service process.

The sample action stress determination sub-module 133 is configured to select at least one rim danger stress ranked highest among the stress frequency sorting results from the stress spectrum of the dangerous part of the rim as the target stress.

The action stress frequency determination sub-module 134 is configured to perform, for each target stress, multiplication operation upon an occurrence frequency in the unit mileage of the target stress and the expected simulation mileage, to obtain the stress application frequency of the target stress.

It should be noted that the basic principle and technical effects of the wheel-rail steel equivalent fatigue damage simulation device 100 provided by the embodiment of the present application are the same as those of the above-mentioned wheel-rail steel equivalent fatigue damage simulation method. Some details are not mentioned in this embodiment are omitted here for brevity, as they can be referred to the above description of the equivalent fatigue damage simulation method of wheel-rail steel.

In the embodiment provided in the present application, it should be understood that the disclosed device and method may also be implemented in other ways. The above-mentioned device embodiments are only schematic. For example, the flowcharts and block diagrams in the drawings show the architectures, functions and operations of possible implementations of the devices, methods and computer program products according to the embodiments of the present application. In this regard, each block in the flow-chart or block diagram may represent a module, program segment or part of code, and the module, program segment or part of code may contain one or more executable instructions for implementing the specified logical functions. It should also be noted that in some alternative implementations, the functions marked in the blocks may also occur in a different order than those marked in the drawings. For example, two consecutive blocks may actually be executed basically in parallel, and they may sometimes be executed in reverse order, depending on the functions involved. It should also be noted that each block in the block diagram and/or flowchart, and the combination of blocks in the block diagram and/or flowchart, may be implemented by a dedicated hardware-based system that performs specified functions or actions, or may be implemented by a combination of dedicated hardware and computer instructions.

In addition, each functional module in each embodiment of the present application may be integrated together to form an independent part, or each module may exist alone, or two or more modules may be integrated to form an independent part. If the functions are implemented in the form of software function modules and sold or used as independent products, they may be stored in a storage medium. In this sense, the part of the technical solution of the present application that essentially contributes to the prior art or the part of this technical solution may be embodied in the form of a software product, which is stored in a readable storage medium and includes a number of instructions to make a computing device (which may be a personal computer, a server, or a network device, etc.) perform all or part of the steps of the methods described in various embodiments of the present application. The aforementioned readable storage media may include: a USB disk, portable hard disk, read-only memory (ROM), random access memory (RAM), disk or compact disk (CD) and other medium that can store program codes.

To sum up, in the method, device, computer equipment and readable storage medium for simulating the equivalent fatigue damage of wheel-rail steel provided by the present application, after obtaining the train load spectrum when the target train serves for the preset mileage, the present application will assign the wheel-rail systematic three-dimensional model corresponding to the target train to simulate the load application according to the train load spectrum, so as to obtain the stress spectrum of the dangerous part of the rim of the target train. Then, according to the stress spectrum of the dangerous part of the rim, the target stress and stress application frequency which need to act on the wheel-rail steel fatigue sample of the target train and correspond to the expected simulated mileage are determined, and then the fatigue test machine is driven to conduct fatigue tests on the wheel-rail steel fatigue sample according to the determined target stress and stress application frequency, so as to obtain the equivalent fatigue damage data of the wheel-rail steel when the target train is in service with the expected simulated mileage, thereby easily and instantly completing the equivalent simulation test according to the actual fatigue damage of the wheel-rail steel during the service of the train, and facilitating the instant initiation of subsequent wheel-rail operation and maintenance.

The above are only the various embodiments of the present application, but the scope of protection of the present application is not limited thereto. Any skilled in the art may easily think of changes or substitutions within the technical scope disclosed in the present application, which should fall within the scope of the present application. Therefore, the claims scope of the present application should be explained based on the claims.

What is claimed is:

1. A method for simulating a wheel-rail steel equivalent fatigue damage, comprising:

acquiring a train load spectrum of a target train serving for a preset mileage;

assigning a wheel-rail systematic three-dimensional model corresponding to the target train according to the train load spectrum, to perform load application simulation to obtain a stress spectrum of a dangerous part of a rim of the target train that is prone to crack, which matches the preset mileage;

determining a target stress and a stress application frequency corresponding to expected simulation mileage to be acted on a wheel-rail steel fatigue sample of the target train according to the stress spectrum of the dangerous part of the rim, which comprises:

sorting respective stress occurrence frequencies of all stresses in the stress spectrum of the dangerous part of the rim in a descending order, to obtain a corresponding stress-frequency sorting result;

performing division operation upon the stress occurrence frequency and the preset mileage of the rim danger stress for each kind of stresses in the stress spectrum of the dangerous part of the rim, to obtain the occurrence frequency in the unit mileage for each stress during the service process of the target train;

selecting at least one wheel rim danger stress with the highest ranking among the stress spectrum of the dangerous part of the rim as the target stress; and performing multiplication operation upon the occurrence frequency in the unit mileage and the expected simulation mileage for each target stress, to obtain the stress application frequency of the target stress; and driving a fatigue test machine to initiate a fatigue test on the wheel-rail steel fatigue sample according to the determined target stress and stress application frequency, to obtain wheel-rail steel equivalent fatigue damage data of the target train serving for the expected simulation mileage.

2. The method according to claim 1, wherein the step of acquiring the train load spectrum of the target train serving for the preset mileage comprises:

calculating a load value of the load in first level among loads in different levels corresponding to the target train in the train load spectrum according to a wheelset weight and train axle load of the target train;

calculating the occurrence frequency of the load in first level during a service process of the preset mileage according to the possibility the load in first level occurs during the service process of the preset mileage and the possibility the loads in different levels occur during the service process of the target train;

calculating respective load values of the loads in different levels based on the load value of the load in first level according to a preset load ratio among the loads in different levels; and calculating frequencies of the respective loads in different levels based on the loads in first level, according to a preset frequency ratio among the loads in different levels.

3. The method according to claim 2, wherein the step of assigning the wheel-rail systematic three-dimensional model corresponding to the target train according to the train load spectrum to perform load application simulation to obtain the stress spectrum of the dangerous part of the rim of the target train matching the preset mileage comprises:

applying each of loads in different levels corresponding to the train load spectrum on the wheel-rail systematic three-dimensional model according to respective load occurrence frequencies, to perform static contact mechanical behavioral simulation on the wheel-rail system, in order to obtain a rim danger stress and stress occurrence frequency of the dangerous part of rim of the target train based on each of the loads in different levels; and performing data arrangement upon rim danger stresses and stress occurrence frequencies respectively corresponding to the loads in different levels corresponding to the train load spectrum, to obtain the stress spectrum of the dangerous part of the rim.

4. A device for simulating wheel-rail steel equivalent fatigue damage comprising:

a processor; and a memory storing instructions that, when executed by the processor, cause the processor to:

acquire a train load spectrum of a target train serving for a preset mileage;

a assign a wheel-rail systematic three-dimensional model corresponding to the target train according to the train load spectrum, to perform load application simulation to obtain a stress spectrum of a dangerous part of a rim of the target train that is prone to crack, which matches the preset mileage;

a determine a target stress and a stress application frequency corresponding to expected simulation mileage to be acted on a wheel-rail steel fatigue sample of the target train according to the stress spectrum of the dangerous part of the rim, by: sorting respective stress occurrence frequencies of all stresses in the stress spectrum in a descending order, to obtain a corresponding stress-frequency sorting result; performing a division operation upon the stress occurrence frequency and the preset mileage for each stress in the stress spectrum, to obtain an occurrence frequency in a unit mileage of the stress during a service process of the target train; selecting at least one stress ranked highest among the stress-frequency sorting result from the stress spectrum as the target stress; and performing, for the target stress, a multiplication operation upon the occurrence frequency in the unit mileage and the expected simulation mileage, to obtain the stress application frequency of the target stress; and drive a fatigue test machine to initiate a fatigue test on the wheel-rail steel fatigue sample according to the determined target stress and stress application frequency, to obtain wheel-rail steel equivalent fatigue damage data of the target train serving for the expected simulation mileage.

5. The device according to claim 4, wherein the instructions cause the processor to acquire the train load spectrum by:

calculating a load value of the load in first level among loads in different levels corresponding to the target train in the train load spectrum according to a wheelset weight and train axle load of the target train; and calculating an occurrence frequency of the load in first level during a service process of the preset mileage according to the possibility the load in first level occurs during the service process of the preset mileage and the possibility the loads in different levels occur during the service process of the target train;

wherein calculating the load value further comprises calculating respective load values of the loads in different levels based on the load value of a load in first level, according to a preset load ratio among the loads in different levels; and wherein calculating the occurrence frequency further comprises calculating frequencies of the respective loads in different levels based on the loads in first level, according to a preset frequency ratio among the loads in different levels.

6. The device according to claim 5, wherein the instructions cause the processor to obtain the stress spectrum by:

applying, respectively according to a corresponding load occurrence frequency, the loads in different levels corresponding to the train load spectrum on the wheel-rail systematic three-dimensional model to perform wheel-rail system static contact mechanical behavioral simulation, in order to obtain a danger stress and stress occurrence frequency of the dangerous part of the rim based on loads in different levels; and performing data arrangement upon respective corresponding danger stresses and stress occurrence frequencies of the loads in different levels corresponding to the train load spectrum, to obtain the stress spectrum of the dangerous part of the rim.

7. A calculation equipment comprising a processor and a memory, wherein the memory stores a calculation process executable by the processor, and the processor executes the calculation process to perform the wheel-rail steel equivalent fatigue damage simulation method according to claim 1.

8. A calculation equipment comprising a processor and a memory, wherein the memory stores a calculation process executable by the processor, and the processor executes the calculation process to perform the wheel-rail steel equivalent fatigue damage simulation method according to claim 2.

9. A calculation equipment comprising a processor and a memory, wherein the memory stores a calculation process executable by the processor, and the processor executes the calculation process to perform the wheel-rail steel equivalent fatigue damage simulation method according to claim 3.

10. A non-transitory readable storage medium storing a calculation process, wherein the calculation process is executed by a processor to perform the wheel-rail steel equivalent fatigue damage simulation method according to claim 1.

11. A non-transitory readable storage medium storing a calculation process, wherein the calculation process is executed by a processor to perform the wheel-rail steel equivalent fatigue damage simulation method according to claim 2.

12. A non-transitory readable storage medium storing a calculation process, wherein the calculation process is executed by a processor to perform the wheel-rail steel equivalent fatigue damage simulation method according to claim 3.

* * * * *